(12) United States Patent
Carrigan

(10) Patent No.: US 7,991,570 B2
(45) Date of Patent: Aug. 2, 2011

(54) POYNTING-VECTOR FILTER

(75) Inventor: Charles R. Carrigan, Tracy, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 208 days.

(21) Appl. No.: 12/255,373

(22) Filed: Oct. 21, 2008

(65) Prior Publication Data

US 2009/0070053 A1    Mar. 12, 2009

Related U.S. Application Data

(63) Continuation-in-part of application No. 11/404,609, filed on Apr. 13, 2006, now Pat. No. 7,440,858.

(60) Provisional application No. 60/671,793, filed on Apr. 15, 2005.

(51) Int. Cl.
*G01R 13/00* (2006.01)

(52) U.S. Cl. ............................................. 702/66

(58) Field of Classification Search .................... 702/66; 356/491; 340/935; 342/448
See application file for complete search history.

(56) References Cited

U.S. PATENT DOCUMENTS

| 3,778,761 | A | * | 12/1973 | Cribbins | .................. 340/935 |
| 5,315,308 | A | * | 5/1994 | Nehorai et al. | .............. 342/448 |
| 6,674,532 | B2 | * | 1/2004 | VanDelden | .................. 356/491 |

* cited by examiner

*Primary Examiner* — Drew A Dunn
*Assistant Examiner* — Xiuquin Sun
(74) *Attorney, Agent, or Firm* — John P. Wooldridge

(57) ABSTRACT

A determination is made of frequency components associated with a particular bearing or location resulting from sources emitting electromagnetic-wave energy for which a Poynting-Vector can be defined. The broadband frequency components associated with a specific direction or location of interest are isolated from other components in the power spectrum that are not associated with the direction or location of interest. The collection of pointing vectors can be used to characterize the source.

13 Claims, 2 Drawing Sheets

POYNTING-VECTOR FILTER

This is a continuation-in-part of U.S. patent application Ser. No. 11/404,609 (now U.S. Pat. No. 7,440,858) titled: "A POYNTING-VECTOR BASED METHOD FOR DETERMINING THE BEARING AND LOCATION OF ELECTROMAGNETIC SOURCES", filed Apr. 13, 2006, incorporated herein by reference, which claims priority to U.S. Provisional Patent Application No. 60/671,793, filed Apr. 15, 2005, and incorporated by reference.

The United States Government has rights in this invention pursuant to Contract No. DE-AC52-07NA27344 between the United States Department of Energy and Lawrence Livermore National Security, LLC.

BACKGROUND OF THE INVENTION

1. Field of the Invention

The present invention relates to the methods for identifying the location of a source of electromagnetic radiation, and more specifically, it relates to the detection of unknown electromagnetic signals from broadband noise and the use of their Poynting vectors to identify the location of the signal source.

2. Description of Related Art

A major complication encountered in characterizing the electronic emissions of a facility or any other radiating electromagnetic source is that the signals of interest are often buried across the frequency spectrum of a noisy broadband record. Unless it is fortuitously known exactly what to look for, it will be impossible to pick out a facility's or electrical device's/system's contributions (i.e., radiated signals) to a broadband data stream using just conventional filtering techniques. A data acquisition/processing method is desired that can both (i) extract a weak signal and (ii) show which of the spectral lines or peaks distributed over a range of frequency in the power spectrum are related (i.e., emanate from the same source or direction) for any type of monitoring or signal-characterization activities.

SUMMARY OF THE INVENTION

It is an object of the present invention to provide a filtering method that determines the frequency components or content of an unknown electromagnetic signal that is distributed across a broadband frequency spectrum through the association of the components with a known bearing or location and a known source emitting electromagnetic-wave energy for which a Poynting-Vector can be defined or identified a priori.

Another object is to provide a novel signal filtering or tagging method that allows frequency components or content in the electromagnetic spectrum to be grouped or separated from the broadband spectrum according to the characteristic of having the same observed Poynting vector, which tends to indicate a common source, in the absence of detailed information about location, bearing or source characteristics.

These and other objects will be apparent based on the disclosure herein.

In an exemplary embodiment of the invention, a tri-axial (x, y and z) E field detector and a tri-axial B field detector collect signals for a time period. The sampling rate is set to be sufficiently high, according to the Nyquist Sampling Theorem to record the highest frequencies of interest. In the realization of this method, typical sampling rates in the range of 20 KHz to greater than 1 MHz have been used. Employing a variant (D) of the method described below, a Fast Fourier Transform is produced for each E field and B field component of the data set (i.e., 6 total components), which corresponds to the Nyquist frequency-limited broadband frequency spectrum collected/detected by the acquisition system. Each transform is divided into bins, for example, the entire transform could cover a spectrum from 0 to 10 KHz, and each bin could be set to span 1 Hz sections. Poynting vectors are then calculated for a given bin using the E and B field amplitude information associated with that bin. This is done for all bins. A determination is made which Poynting vectors are the same. The identical Poynting vectors are combined onto a single data representation, which thus provides a collection of frequency components or harmonics emanating from one location or direction.

If the frequency bin width is too broad, it may cover more than the signal of interest, and the resulting calculated Poynting vector may not be identical to others that include only the signal of interest. Added signal processing steps, e.g., a correlation filter utilizing signal amplitude fluctuations in all six channels, can be introduced to improve the s/n in such cases.

The intriguing results of a previous experiment (Carrizo Plains Feasibility Study, 2004) as well as numerical simulations show that the measurement and calculation of the Poynting vector offers a highly compelling partial if not complete solution to the problem of picking an unknown signal from broadband noise. Electromagnetic radiation involves the propagation of both electric and magnetic fields. The vector cross product of the instantaneous electric field (E) and the magnetic field (B) or E×B gives the time-dependent Poynting vector that provides directionality information about the source of the electromagnetic radiation. The vector cross product representing the Poynting vector (S) may further be expressed in terms of the unit vectors i, j and k along the respective x,y and z axes as $$S=E\times B=(E_yB_z-E_zB_y)i+(E_zB_x-E_xB_z)j+(E_xB_y-E_yB_x)k \quad \text{(EQN 1).}$$

In the experiment, triaxial B-field and E-field sensors were set up in the vicinity of an electrical noise (unintended radio emissions) source representing equipment that might be encountered in a facility producing electrical signals of interest. Measurements of the 6 components were made with a 24-bit data acquisition system at per channel sample rates of 100 kHz and contemporaneous segments of the 6-component data stream were analyzed using fast Fourier transforms (FFT).

Electromagnetic signals associated with a given source of interest may be radiated over a broad band in frequency that is interspersed with noise or other potentially interfering signals. In this case a power spectrum analysis will reveal many components at different frequencies, but without further information the frequency components of the signal of interest cannot be separated from the components of the noise or other interfering signals. The method described here permits the determination of frequency components associated with a particular bearing or location resulting from sources emitting electromagnetic-wave energy for which a Poynting-Vector can be defined. In effect, the broadband frequency components associated with a specific direction or location of interest can be "tagged" or isolated from other components in the power spectrum that are not associated with the direction or location of interest. Alternatively, this method may be described as using the Poynting vector as a characteristic of the signal of interest to filter or separate a signal's spectral components from other sources of interference or noise in a broadband spectrum. Typical sources include alternating current (AC) generators and loads, power lines, transformers or radio-frequency (rf) transmitters. The method can be applied to stationary and/or moving sources using stationary and/or moving sensors (E- and B-field) to isolate or tag the frequency components of a signal of interest. The method can also be extended to arrays of sensors.

The method is suitable for the detection, characterization, identification or reconstruction of electromagnetic signals composed of radiating electric (E) and magnetic (B) fields emitted by stationary or moving (e.g., cars, trucks, tanks, boats, submarines, airplanes and space vehicles, etc.) AC generators, transmitters, electrical conductors and loads; for spatial mapping of fields and remote source characterization and temporal assessment of electrical usage and for identification and/or characterization of any radiating mobile source/load systems for which a Poynting vector may be determined.

Examples of uses of the invention include subsurface power line and electrical facility detection and characterization, time-based assessment and mapping of power usage, identification/characterization of electromagnetic signal (e.g., antennas) and signal/noise sources, vehicle tracking and monitoring of sites for security purposes.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

The invention is a method for providing the Poynting Vector "tag" for each harmonic or frequency component of a radiating electrical source/load system. This tag, which is unique to radiation from a particular location, corresponds to the bearing of a radiating electrical source/load system and is useful for facility/system monitoring and characterization purposes. For simplicity, the description given here involves a single set of sensors (one triaxial E and one triaxial B-field sensor) but can readily be extended to a network of sensors for detecting and tagging a variety of signal sources below and above the Earth's surface, in and on bodies of water as well as in the atmosphere and space.

Figure 1:
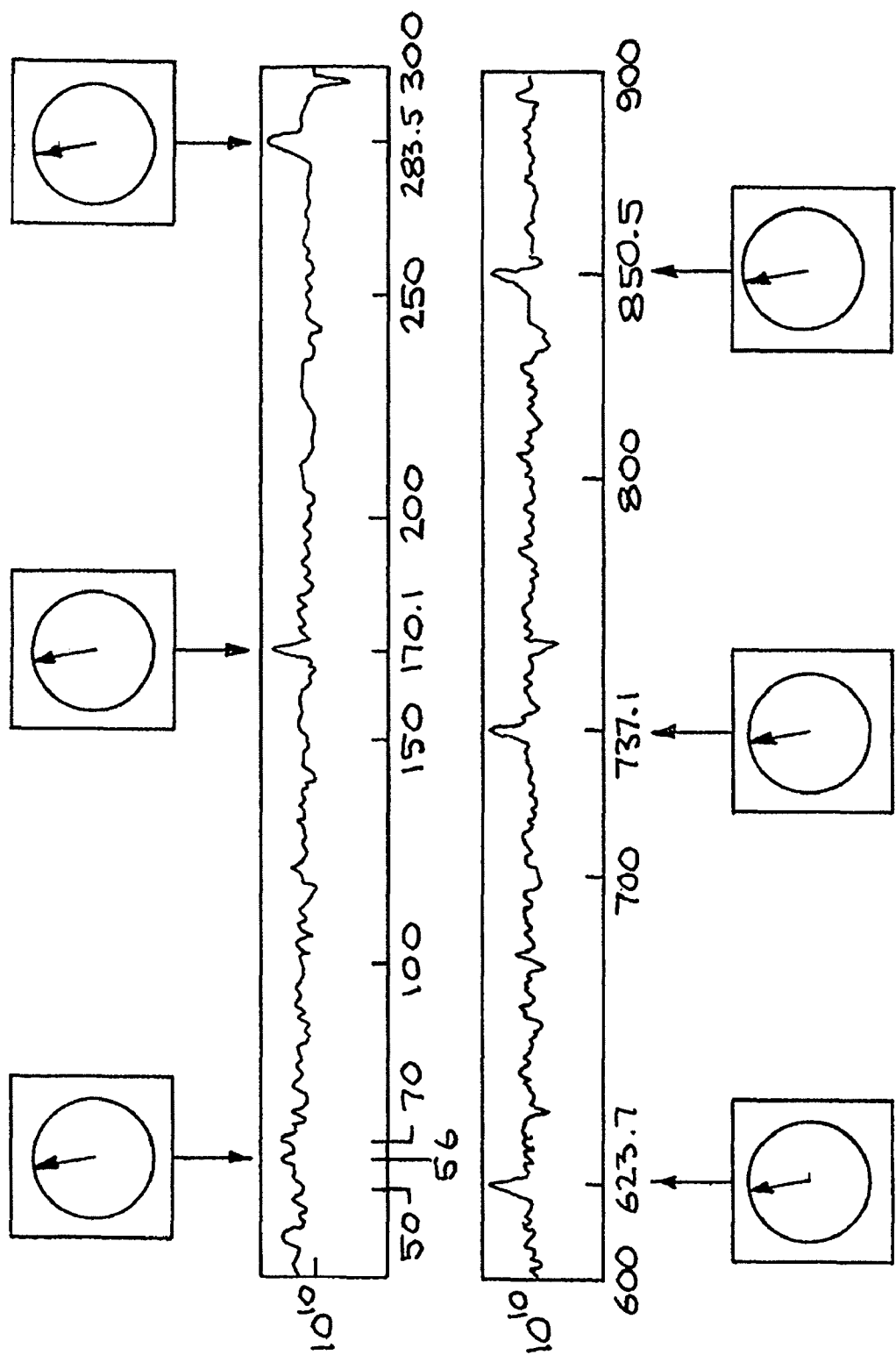
FIG. 1 shows peaks in the power spectrum associated with harmonics of detected power/load system as well as virtually identical azimuthal Poynting vectors calculated for each harmonic.

FIG. 1 shows peaks in the power spectrum associated with harmonics of detected power/load system as well as virtually identical azimuthal Poynting vectors calculated for each harmonic. Poynting vectors calculated for other, unrelated peaks in the spectrum will be in different directions. Because the AC-electrical source was offset slightly from 60 Hz in this case, the harmonic components of noise produced by the source could be unambiguously identified. It was found that the FFTs of the six components showed peaks in the spectrum at the offset fundamental frequency as well as at a number of odd harmonics (i.e., 3, 5, 7, etc.) of the fundamental frequency. Filtering the six component data streams at a harmonic frequency extracted harmonic signatures from the data streams that were then combined to calculate the time-dependent Poynting vector. Averaging this time dependence or alternatively "binning" each sample of this time-dependent vector on a Rose plot yielded a direction that was associated with each harmonic. Importantly, it was found that any harmonic that was identified with the source signal was also characterized by the same Poynting vector as shown by the orientation of the largest bins in the Rose plots of FIG. 1. It is this result that provides the basis for applying the novel signal-extraction technique described here. Every harmonic or component of the signal from our source had very similar or the same Poynting vector directions as expressed by the bin distribution of the Rose plots. Thus, picking only signal components or harmonics that have the same spatial direction allows reconstructing the signal emanating from that direction. (Note: If it is known in advance that a signal involves a fundamental and its harmonics, an increase in the power of this method results as use can also be made of correlations between harmonics, such as amplitude fluctuations, in addition to the Poynting vector to enhance the signal-to-noise ratio.)

Figure 2:
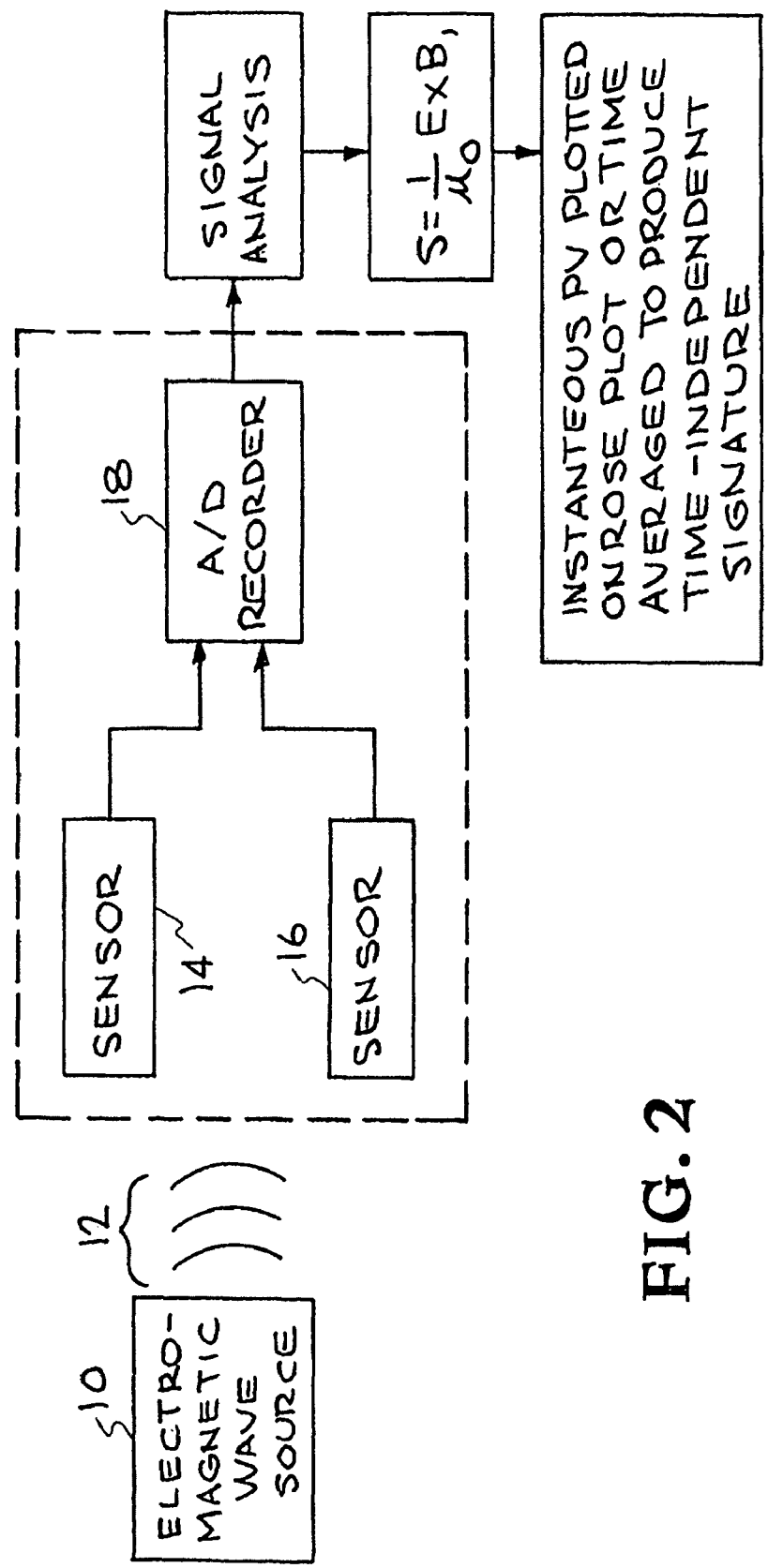
FIG. 2 is a schematic illustrating a process for acquiring data and then evaluating data to obtain Poynting vector "tags" for peaks in the power spectrum obtained from the acquired data.

FIG. 2 shows a schematic of an apparatus for acquiring data to obtain Poynting vector "tags" for peaks in the power spectrum obtained from the acquired data. The first stage involves signal sensing and conversion of the analog signal from the E- and B-field sensors to a digital format. Six channels are recorded corresponding to the three-axis measurements of both the electric and magnetic fields. The vector components of the E and B fields are necessary for determination of the Poynting vector, S, as shown in the equation above. The figure shows a generic electromagnetic wave source 10. For example, source 10 could be a generator/load or a facility with an electromagnetic output. Electromagnetic waves 12 are produced by source 10. Magnetic component of these waves are detected by tri-axial B-field sensor 14. Sensors for detecting magnetic field data are known in the art (e.g., 3 Schlumberger-EMI BF-6 coil magnetometers). The present invention orients these sensors to collect magnetic wave component data along the x-y-z axes. Electrical components of waves 12 are detected by tri-axial E-field sensor 16. Sensors for detecting electrical field data are known in the art (e.g., Quasar-Federal triaxial E field sensor). Accordingly, each sensor provides 3 channels, and data from a total of 6 channels from the pair of sensors is transmitted to an analog-to-digital recorder 18. After the data is digitized, several variations in the method of analysis can be used to calculate required E- and B-field components from the signal and noise data stream to isolate spectral peaks having a common Poynting vector tag, as discussed below.

A. The first method requires performing (a) a power spectrum analysis on precisely contemporaneous segments of the broadband data streams from each of the six channels. This spectral analysis, performed on each channel of data, gives the power in the broadband signal at each frequency up to the Nyquist frequency. Using this distribution of broadband signal power versus frequency in all six channels, (b) a set or list is generated of those values of the frequency at which spectral peaks appear above background noise in all six channels. That is, a spectral peak appearing at a certain frequency in the analysis of one channel must also appear at that same frequency in all the other channels if that frequency is to be a member of the list. (c) A narrow bandpass filter (e.g., Butterworth, Chebyshev or similar filtering method), is constructed for each member of the list with the central frequency of each narrow bandpass filter corresponding to the frequency value given in the list or set. The bandwidth of the narrow bandpass filter that is constructed corresponds to the frequency resolution of the data stream, which is given by $f_s/n$, where $f_s$ is the sampling rate used to obtain the data and n is the number of samples in a data stream. (d) Each filter is then applied to the data stream segment obtained from each channel. This eliminates all frequency information in the data stream segment of each channel except for that in the bandpass frequency range of each filter. The result of this process is the generation of six digital monochromatic wavetrains, corresponding to all spatial components of the electric (i.e., $E_x$, $E_y$, and $E_z$) and magnetic fields (i.e., $B_x$, $B_y$, and $B_z$), for each frequency in the list or set of frequencies. (e) Samples of the wave train amplitude, corresponding to the same sample time, are then taken from each of the six wave trains. These six amplitudes correspond to the instantaneous values of the E and B fields at the sample time that are associated with a given spectral peak in the power spectrum and (f) they are used in the Equation 1 above to calculate an instantaneous value of the Poynting vector, S. (g) Similarly, a collection or set of consecutive Poynting vectors in time is calculated from a series of consecutive samples in time of the amplitudes taken from the six single-frequency wavetrains. Because the resulting set of Poynting vectors may vary in a complex fashion from sample to sample, indicating a complex time dependence, some method to both record and visualize this characteristic variation of the Poynting vector must be employed if the Poynting vector is to be used as a characteristic of spectral peaks having a common origin. (h) The method used is to plot the number of occurrences of each value of the azimuthal angle of the Poynting vector versus the azimuthal angle itself, as obtained from the x and y components of the Poynting vector, for the range of azimuthal angles in the set of consecutive Poynting vectors. In polar coordinates, this produces a Rose plot exhibiting a characteristic distribution of values of the azimuthal angle as a function of the azimuthal angle itself. (i) The process for calculating a Poynting vector for each spectral peak is repeated for all selected peaks in the power spectrum by returning to step (d) and following the sequence of steps in order until Poynting vectors as represented on Rose plots have been computed for all selected frequencies. (j) The frequencies of spectral peaks, which exhibit the same characteristic Rose plot distribution of azimuthal angle, are subsequently recorded as being related in origin. Finally (i), the amplitudes, calculated from the E and B wavetrains that exhibit the same Poynting vector Rose plot distribution are used to reconstruct the signal if desired using, for example, a Fourier series approach in which a coefficient of one of the terms in the series corresponds to the amplitude of a particular spectral component while the frequency of the spectral component corresponds to the frequency of the trigonometric function (sine or cosine) appearing in that particular term. Alternatively, the amplitudes of the spectral components having a common Poynting vector can be used in other schemes for signal characterization, such as simply listing the amplitudes and their frequencies that make up each E and B field spatial component.

B. A variant analysis method of A. takes the six broadband data streams obtained in stage (1) and (a) calculates a Fast Fourier Transform (FFT) for each of the six data streams using a contemporaneous segment of data from each data stream. (b) For a given frequency, the real and imaginary parts of a complex amplitude of each spatial field component (e.g., $E_x$, $E_y$, $E_z$ and $B_x$, $B_y$, $B_z$) may be identified in the FFT. (c) The complex representation of each E-field component in Equation 1 is multiplied by the complex conjugate of the appropriate B field component, denoted with an asterisk (*), such that we obtain an expression for the complex Poynting vector S, $$S = E \times B^* = (E_y B_z^* - E_z B_y^*)i + (E_z B_x^* - E_x B_z^*)j + (E_x B_y^* - E_y B_x^*)k.$$

(d) Taking the Real part of the equation for S (i.e., RE{S}) and (e) multiplying the result by a factor of 0.5 yields a time-averaged Poynting vector. (e) Represent the results for a each frequency using a plot of the azimuthal angle as calculated from the x and y or i and j components provided in (d). Alternative representations of the results of (d) are possible, such as a three-dimensional Poynting vector visualization, and may be preferable depending on the application. (f) Repeat sections (b) through (e) for all frequencies of interest. (g) Form a set of frequencies that are characterized by the same Poynting vector representation. Finally (g), the amplitudes, calculated from Fast Fourier Transforms of E and B wavetrains that exhibit the same Poynting vector representation are used to reconstruct the signal if desired using, for example, a Fourier series approach in which a coefficient of one of the terms in the series corresponds to the amplitude of a particular frequency component while the frequency of the spectral component corresponds to the frequency of the trigonometric function (sine or cosine) appearing in that particular term. Alternatively, the amplitudes of the spectral components having a common Poynting vector can be used in other schemes for signal characterization, such as simply listing the amplitudes and their frequencies that make up each E and B field spatial component.

C. Another variant, which replaces (A-h) is to employ averaging in time of the values of the azimuthal angle of the Poynting vector. This is an alternative to calculating a Rose plot of the stream of instantaneous Poynting vectors. Time averages may be over an integral number of periods at a given frequency.

D. A variant of A-b is to divide the power spectrum of interest for each channel into a series of continuous, narrow frequency bins and calculate the Poynting vector for each frequency bin using signal amplitude information from each frequency bin, rather than generating only a set or list of those values of the frequency at which spectral peaks appear above background noise in all six channels as done in A-b. In this case, the frequency bin width is given by the frequency resolution of the data set, which is given by $f_s/n$, where $f_s$ is the sampling rate used to obtain the data and n is the number of samples in a data stream. The amplitudes of the signals in individual frequency bins can be calculated using a narrow bandpass filter set to the center frequency and width of each bin. This variant can also be applied to method B in a similar manner.

The foregoing description of the invention has been presented for purposes of illustration and description and is not intended to be exhaustive or to limit the invention to the precise form disclosed. Many modifications and variations are possible in light of the above teaching. The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

I claim:
1. A method for reconstructing a signal of interest, comprising:
  producing a collection of Poynting vectors by:
    collecting magnetic-field data along three orthogonal axes, wherein said magnetic-field data is collected with a tri-axial B-field sensor;
    collecting electric-field data along three orthogonal axes, wherein said electric-field data is collected with a tri-axial E-field sensor;
    digitizing said magnetic-field data and said electrical-field data to produce digitized data;

producing calculated E-field components and B-field components from said digitized data; and calculating said collection of Poynting vectors from said calculated E-field components and B-field components;

the method further comprising:

identifying, from said collection of Poynting vectors, spectral peaks having a common Poynting vector, to produce a set of commonly oriented Poynting vectors; and reconstructing a signal of interest from said set of commonly oriented Poynting vectors.

2. The method of claim 1, further comprising:

selecting spectral peaks within said magnetic-field data and within said electric-field data;

filtering said spectral peaks to produce said digitized data, wherein said digitized data is represented in the form of six digital wave trains, one for each axis of collected data; and sampling each said wave train of said six digital wave trains at identical time periods to produce said E-field components and said B-field components.

3. The method of claim 2, wherein the step of selecting spectral peaks includes performing power spectrum analyses on precisely contemporaneous segments of said magnetic-field data and said electric-field data.

4. The method of claim 3, further comprising generating a set or list of those values of the frequency of said power spectrum analyses at which spectral peaks appear above background noise in all six channels.

5. The method of claim 3, further comprising binning each power spectrum of said power spectrum analyses.

6. The method of claim 2, wherein the step of filtering said spectral peaks comprises applying a filtering method to said spectral peaks.

7. The method of claim 6, wherein said filtering method is selected from the group consisting of a Butterworth filtering method and a Chebyshev filtering method.

8. The method of claim 2, further comprising binning said spectral peaks.

9. The method of claim 8, wherein said digitized data comprises a series of continuous narrow frequency bins, wherein said calculated E-field components and B-field components are produced using signal amplitude information from each frequency bin of said series of continuous narrow frequency bins.

10. The method of claim 1, further comprising calculating Fast Fourier Transforms from said magnetic-field data and said electric-field data.

11. The method of claim 1, further comprising averaging in time a value of each Poynting vector of said collection of Poynting vectors.

12. The method of claim 1, wherein said digitized data comprises a series of continuous narrow frequency bins, wherein said calculated E-field components and B-field components are produced using signal amplitude information from each frequency bin of said series of continuous narrow frequency bins.

13. The method of claim 1, wherein said orientation is within a selected range.

\* \* \* \* \*